United States Patent
DeAngelis et al.

(10) Patent No.: US 8,365,977 B2
(45) Date of Patent: Feb. 5, 2013

(54) ULTRASONIC TRANSDUCERS FOR WIRE BONDING AND METHODS OF FORMING WIRE BONDS USING ULTRASONIC TRANSDUCERS

(75) Inventors: Dominick A. DeAngelis, Villanova, PA (US); Gary W. Schulze, Bethlehem, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 13/557,925

(22) Filed: Jul. 25, 2012

(65) Prior Publication Data

US 2012/0286023 A1 Nov. 15, 2012

Related U.S. Application Data

(62) Division of application No. 13/388,148, filed as application No. PCT/US2010/044976 on Aug. 10, 2010, now Pat. No. 8,251,275.

(60) Provisional application No. 61/233,237, filed on Aug. 12, 2009.

(51) Int. Cl.
  *B23K 1/06* (2006.01)
  *B29C 65/08* (2006.01)
(52) U.S. Cl. .................. 228/1.1; 228/4.5; 156/580.1
(58) Field of Classification Search ................. None
  See application file for complete search history.

(56) References Cited

U.S. PATENT DOCUMENTS

| 4,938,217 A | * | 7/1990 | Lele | 601/3 |
|---|---|---|---|---|
| 5,237,237 A | * | 8/1993 | Ueda et al. | 310/323.08 |
| 5,469,011 A | | 11/1995 | Safabakhsh | |
| 5,494,207 A | * | 2/1996 | Asanasavest | 228/110.1 |
| 5,578,888 A | | 11/1996 | Safabakhsh | |
| 5,595,328 A | | 1/1997 | Safabakhsh et al. | |
| 5,603,445 A | | 2/1997 | Hill et al. | |
| 5,699,950 A | | 12/1997 | Jang | |
| 5,699,953 A | | 12/1997 | Safabakhsh | |
| 5,795,419 A | | 8/1998 | Lotz et al. | |
| 5,816,476 A | | 10/1998 | Buice et al. | |
| 5,832,412 A | | 11/1998 | Guez | |
| 5,884,834 A | | 3/1999 | Vinson et al. | |
| 5,884,835 A | | 3/1999 | Kajiwara et al. | |
| 5,890,643 A | | 4/1999 | Razon et al. | |
| 6,116,490 A | | 9/2000 | Suzuki et al. | |
| 6,190,497 B1 | | 2/2001 | Chan et al. | |
| 6,244,498 B1 | | 6/2001 | Jiang et al. | |
| 6,286,747 B1 | | 9/2001 | Chan et al. | |
| 6,299,051 B1 | | 10/2001 | Tsujino | |

(Continued)

FOREIGN PATENT DOCUMENTS

| JP | 63-118715 | 5/1988 |
|---|---|---|
| JP | 63-239834 | 10/1988 |

(Continued)

OTHER PUBLICATIONS

Derwent-Acc-No. 1998-373865 which corresponds to JP-10-150785A (published 1998).*

(Continued)

*Primary Examiner* — Kiley Stoner
(74) *Attorney, Agent, or Firm* — Christopher M. Spletzer, Sr.

(57) ABSTRACT

A method of forming a wire bond using a bonding tool coupled to a transducer is provided. The method includes the steps of: (1) applying electrical energy to a driver of the transducer at a first frequency; and (2) applying electrical energy to the driver at a second frequency concurrently with the application of the electrical energy at the first frequency, the first frequency and the second frequency being different from one another.

44 Claims, 12 Drawing Sheets

U.S. PATENT DOCUMENTS

| | | |
|---|---|---|
| 6,648,205 B2 | 11/2003 | Mayer et al. |
| 6,672,503 B2 | 1/2004 | Or et al. |
| 6,995,498 B2 | 2/2006 | Wallaschek et al. |
| 7,002,283 B2 | 2/2006 | Li et al. |
| 7,137,543 B2 | 11/2006 | DeAngelis et al. |
| 7,441,689 B2 | 10/2008 | Crasser |
| 7,611,039 B2 | 11/2009 | Hesse et al. |
| 2003/0134223 A1 | 7/2003 | Katano et al. |
| 2004/0007065 A1 | 1/2004 | Fujimoto et al. |
| 2004/0250621 A1 | 12/2004 | Fujimoto et al. |
| 2004/0251780 A1 | 12/2004 | Goodson |
| 2005/0122003 A1 | 6/2005 | Goodson |
| 2006/0000870 A1 | 1/2006 | Matsumura |
| 2006/0022016 A1 | 2/2006 | DeAngelis et al. |
| 2007/0222339 A1* | 9/2007 | Lukacs et al. .............. 310/335 |
| 2007/0283985 A1 | 12/2007 | Goodson |
| 2008/0284285 A1* | 11/2008 | Sato .................... 310/323.16 |
| 2009/0026891 A1* | 1/2009 | Koc ............................ 310/358 |
| 2009/0248364 A1 | 10/2009 | Puskas |
| 2010/0127599 A1 | 5/2010 | Thuerlemann et al. |

FOREIGN PATENT DOCUMENTS

| | | |
|---|---|---|
| JP | 02-311181 A * | 12/1990 |
| JP | 6005666 | 1/1994 |
| JP | 06-045411 | 2/1994 |
| JP | 06-204302 | 7/1994 |
| JP | 10-154722 | 6/1998 |
| JP | 2000-253496 A * | 9/2000 |
| JP | 2005252978 | 9/2005 |
| WO | WO2008-122499 | 10/2008 |

OTHER PUBLICATIONS

International Search Report dated Mar. 21, 2011 from PCT Application No. PCT/US2010/044976 filed Aug. 10, 2010.

* cited by examiner

ULTRASONIC TRANSDUCERS FOR WIRE BONDING AND METHODS OF FORMING WIRE BONDS USING ULTRASONIC TRANSDUCERS

CROSS-REFERENCE TO RELATED APPLICATION

This application is a divisional application of U.S. patent application Ser. No. 13/388,148 filed Jan. 31, 2012, now U.S. Pat. No. 8,251,275, which claims the benefit of PCT Patent Application No. PCT/US2010/044976 filed Aug. 10, 2010, which claims the benefit of U.S. Provisional Application No. 61/233,237, filed Aug. 12, 2009, the contents of all of which are incorporated herein by reference.

FIELD OF THE INVENTION

The present invention relates to the operation of a wire bonding machine, and more particularly, to improved ultrasonic transducers and methods of operating ultrasonic transducers in connection with the formation of wire bonds.

BACKGROUND OF THE INVENTION

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected. Wire bonding machines may also be used to form conductive bumps (which bumps may, or may not, be used in connection with wire loops).

An exemplary conventional wire bonding sequence includes: (1) forming a free air ball on an end of a wire extending from a bonding tool; (2) forming a first bond on a die pad of a semiconductor die using the free air ball; (3) extending a length of wire in a desired shape between the die pad and a lead of a leadframe; (4) stitch bonding the wire to the lead of the leadframe; and (5) severing the wire. In forming the bonds between (a) the ends of the wire loop and (b) the bond site (e.g., a die pad, a lead, etc.) varying types of bonding energy may be used including, for example, ultrasonic energy, thermosonic energy, thermocompressive energy, amongst others.

U.S. Pat. No. 5,595,328 (titled "SELF ISOLATING ULTRASONIC TRANSDUCER"); U.S. Pat. No. 5,699,953 (titled "MULTI RESONANCE UNIBODY ULTRASONIC TRANSDUCER"); U.S. Pat. No. 5,884,834 (titled "MULTI-FREQUENCY ULTRASONIC WIRE BONDER AND METHOD"); and U.S. Pat. No. 7,137,543 (titled "INTEGRATED FLEXURE MOUNT SCHEME FOR DYNAMIC ISOLATION OF ULTRASONIC TRANSDUCERS") relate to ultrasonic transducers and are herein incorporated by reference in their entirety. Ultrasonic bonding energy is typically applied using an ultrasonic transducer, where the bonding tool is attached to the transducer. The transducer typically includes a driver such as a stack of piezoelectric elements (e.g., piezoelectric crystals, piezoelectric ceramics, etc.). Electrical energy is applied to the driver, and converts the electrical energy to mechanical energy, thereby moving the bonding tool tip in a scrubbing motion. This scrubbing motion of the bonding tool tip is typically linear motion along the longitudinal axis of the transducer.

It would be desirable to provide improved transducers for use in connection with wire bonding machines, and improved methods of forming wire bonds using transducers.

SUMMARY OF THE INVENTION

According to an exemplary embodiment of the present invention, a method of forming a wire bond using a bonding tool coupled to a transducer is provided. The method includes the steps of: (1) applying electrical energy to a driver of the transducer at a first frequency; and (2) applying electrical energy to the driver at a second frequency concurrently with the application of the electrical energy at the first frequency, the first frequency and the second frequency being different from one another.

According to another exemplary embodiment of the present invention, another method of forming a wire bond using a bonding tool coupled to a transducer is provided. The method includes the steps of: (1) applying electrical energy to a driver of the transducer at a first frequency to drive a tip of the bonding tool in a first direction; and (2) applying electrical energy to the driver at a second frequency to drive a tip of the bonding tool in a second direction, the first direction being different than the second direction.

According to another exemplary embodiment of the present invention, a transducer for use in a wire bonding operation is provided. The transducer includes an elongated body portion configured to support a bonding tool. The transducer also includes a driver for providing vibration to the elongated body portion, the driver including a plurality of piezoelectric elements, each of the plurality of piezoelectric elements being separated into at least two regions electrically isolated from one another.

According to another exemplary embodiment of the present invention, a transducer for use in a wire bonding operation is provided. The transducer includes an elongated body portion configured to support a bonding tool. The transducer also includes a driver for providing vibration to the elongated body portion, the driver being configured to receive electrical energy and to provide a non-linear scrub of a tip of the bonding tool.

According to another exemplary embodiment of the present invention, a transducer for use in a wire bonding operation is provided. The transducer includes an elongated body portion configured to support a bonding tool. The transducer also includes a driver for providing vibration to the elongated body portion, the driver including at least one piezoelectric element configured to deform in a first direction upon the application of electrical energy, and at least one piezoelectric element configured to deform in a second direction upon the application of electrical energy, the first direction and second direction being different from one another.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily deformed or reduced for clarity. Included in the drawing are the following figures.

DETAILED DESCRIPTION OF THE INVENTION

Figure 1:
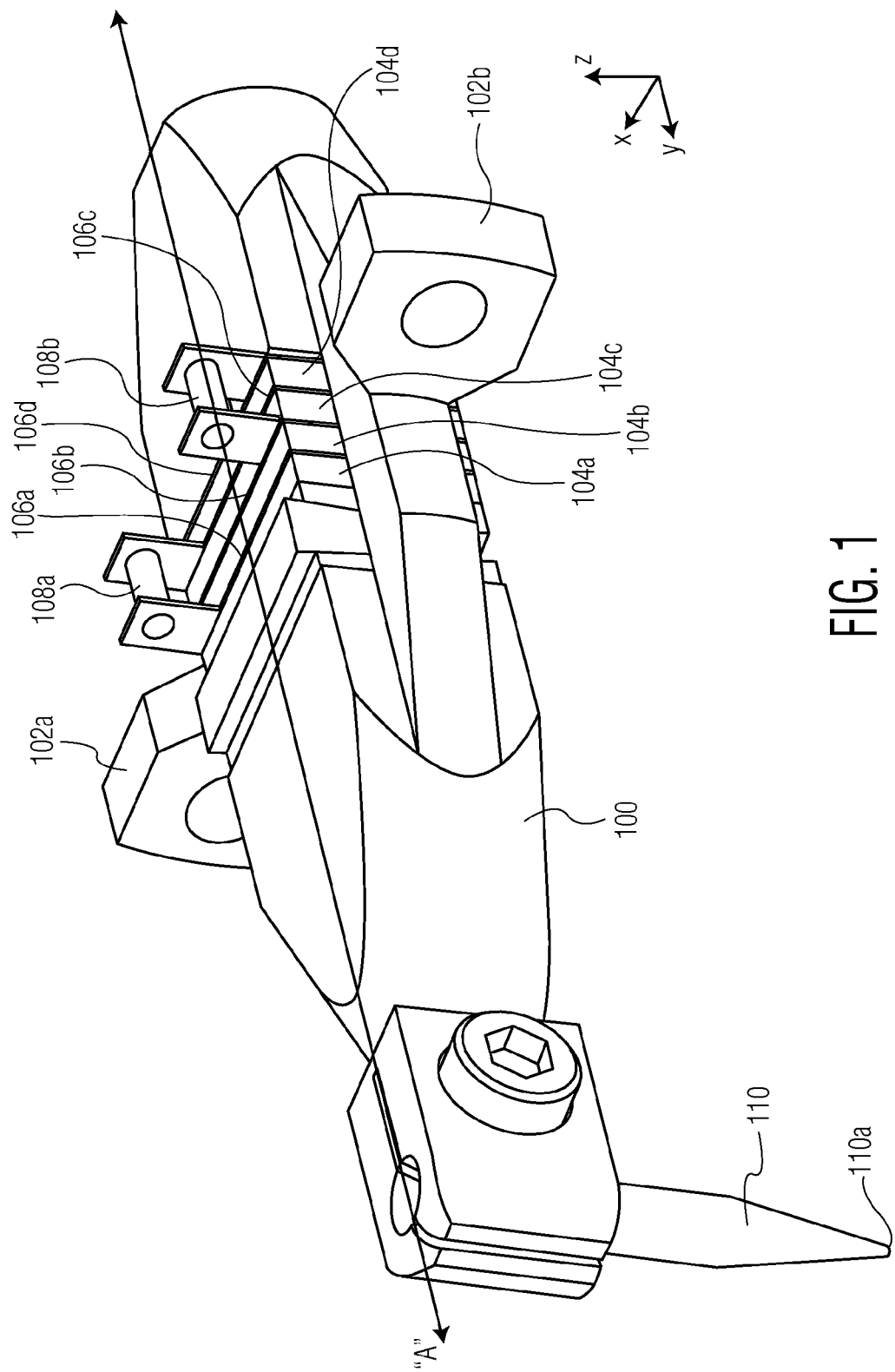
FIG. 1 is a perspective view of a transducer of a wire bonding machine and related components useful in explaining various exemplary embodiments of the present invention.

The present invention relates to various improvements in the operation and/or design of transducers for use in connection with wire bonding operations. According to certain exemplary embodiments of the present invention, an ultrasonic transducer of a wire bonding machine operates simultaneously at two or more modes (i.e., two or more frequencies of electrical energy are applied to the driver of the transducer at the same time). Simultaneous application of multiple frequencies may result in a non-linear scrub of the tip of the bonding tool. For example, the non-linear vibrational pattern may be a Lissajous type pattern such as a circular pattern, an elliptical pattern, or a mesh shaped pattern. The scrub pattern may be planar (i.e., substantially planar at the bonding height) or three dimensional (i.e., non-planar at the bonding height).

An exemplary technique for such a transducer is to segment the individual electrodes of the piezoelectric elements (e.g. crystals), thereby forming at least two electrically isolated regions in each element. For example, the piezoelectric element stack can provide efficient excitation with the segmentation to closely match the independent vibrational mode shape at its particular operating frequency. For example, a yaw bending mode produces scrubbing at the tip of the bonding tool along an X-axis of the wire bonding machine, and a longitudinal mode produces scrubbing at the tip of the bonding tool along a Y-axis of the wire bonding machine. The transducer may also provide one-dimensional independent, or sequential motion, by operating solely at any one of these operating modes/frequencies.

Through certain of the exemplary embodiments of the present invention provided herein, multidirectional (i.e., non-linear) vibrational scrubbing energy is applied to the tip of the bonding tool, thereby resulting in less deformation or collateral damage to the bonded regions adjacent to the welded surfaces. In comparison to conventional techniques, the multidirectional scrubbing motion may result in more uniform bonded balls in both the X and Y bond plane directions, and higher shear strength per unit area for a given ball size. The multidirectional scrubbing motion may also be beneficial in wire bonding applications that are particularly sensitive to pad splash damage in the direction of scrubbing (e.g., copper wire bonding on aluminum pads, amongst others). That is, using multidirectional scrubbing, the pad splash can be more equally distributed around the wire bond (e.g., ball bond).

Additionally, certain exemplary embodiments of the present invention provide independent one-dimensional vibrational energy in a selected one of a plurality directions, for example, to align with device geometries such as wires or lead fingers. By providing for such one-dimensional vibrational energy in the desired direction depending on the bond location (e.g, selecting the direction depending upon the shape of the bonding location) to align with device geometries such as wires or lead fingers tends to provide more consistent energy delivery, and tends to reduce resonant vibrational effects from a given device.

Referring now to FIG. 1, a perspective view of ultrasonic transducer 100 is provided (where transducer 100 has an elongated body portion extending along axis "A"). Transducer 100 includes mounting flanges 102a and 102b used to mount transducer 100 to a bond head of a wire bonding machine. Piezoelectric elements 104a, 104b, 104c, and 104d (e.g., piezoelectric crystals, piezoelectric ceramics, etc.) are arranged in a stack in an aperture defined by the body portion of transducer 100. The stack of piezoelectric elements 104a, 104b, 104c, and 104d is a driver for transducer 100. The elements are separated by conductive shim electrodes 106a, 106b, 106c, and 106d. Electrical energy at a given frequency is applied to terminals 108a and 108b (e.g., 108a is a positive terminal and 108b is a negative terminal), thereby applying electrical energy to shim electrodes 106a, 106b, 106c, and 106d. The application of the electrical energy at the given frequency causes expansion and contraction of the elements, thereby resulting in scrubbing of tip 110a of bonding tool 110 along axis "A" (e.g., the Y-axis of a wire bonding machine). However, in certain applications, it would be desirable to have more flexibility in selecting a scrub in multiple directions for the transducer as opposed to a conventional unidirectional (Y-axis) scrub. In other applications it would be desirable to vary the scrub direction depending upon the shape/configuration of the bonding location (e.g., the bond pad, the lead, etc.). While FIG. 1 illustrates a "unibody" style transducer with an aperture for housing the driver (the stack of crystals), the teachings of the present invention may be applied to other transducer designs such as "horn" style transducers (e.g., where the driver is provided at an end of the transducer body away from the bonding tool tip), amongst others.

Figure 2A:
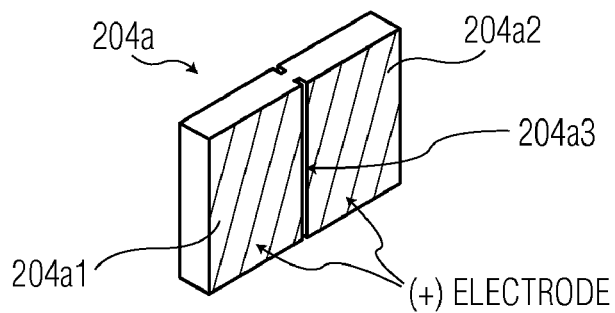
FIGS. 2A-2B are front and back perspective views of a piezoelectric element for use in a transducer in accordance with an exemplary embodiment of the present invention.
Figure 2B:
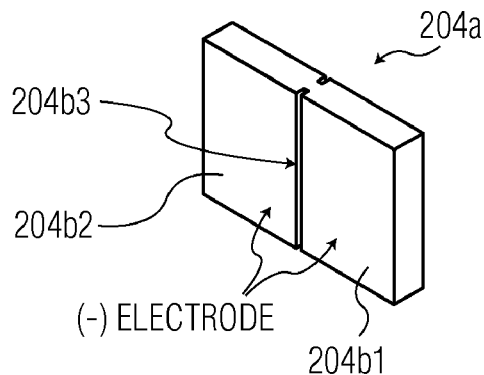

FIG. 2A is a perspective front view of element 204a, and FIG. 2B is a perspective rear view of element 204a. The front surface of element 204a is a positive electrode (e.g., a conductive electrode formed of a material such as, for example, silver, nickel, amongst other materials), and the rear surface of element 204a is a negative electrode. In contrast to elements 104a, 104b, 104c, and 104d shown in FIG. 1, the positive electrode of element 204a is divided by notch/groove 204a3, and the negative electrode of element 204a is divided by notch/groove 204b3. Thus, the positive electrode is divided into two electrically isolated regions 204a1 and 204a2, and the negative electrode is divided into two electrically isolated regions 204b1 and 204b2. Thus, electrical energy may be applied to the element through two electrically isolated paths (i.e., a first path is between regions 204a1 and 204b1, and a second path is between regions 204a2 and 204b2). As will be explained below, the division of the piezoelectric elements into electrically isolated regions allows for application of multiple frequencies of electrical energy to be applied to the driver at a given time, thereby yielding a desirable scrubbing motion at the tip of a bonding tool.

Figure 2C:
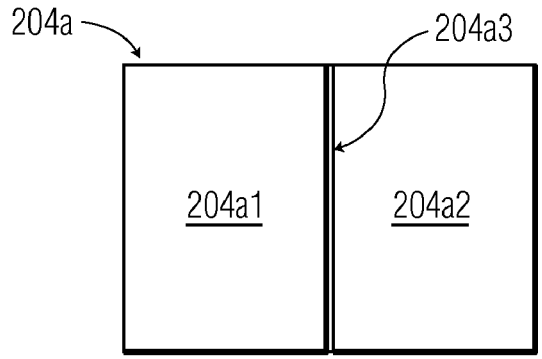
FIG. 2C is a front view of the piezoelectric element of FIGS. 2A-2B.
Figure 2D:
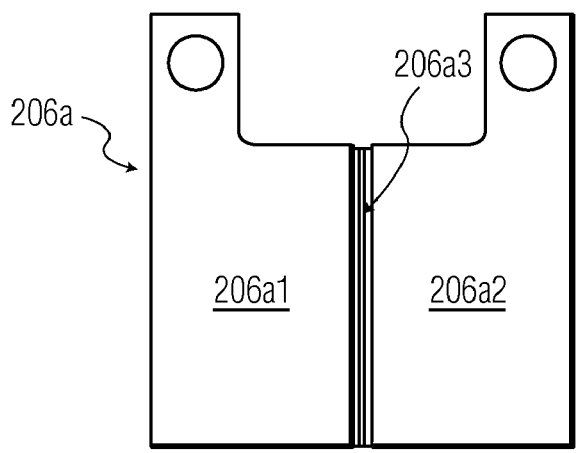
FIG. 2D is a front view of an shim electrode for use in connection with a transducer in accordance with an exemplary embodiment of the present invention.

FIG. 2C is a front view of element 204a. FIG. 2D is a front view of electrode 206a which can be positioned between adjacent piezoelectric elements in a stack in an aperture of a transducer. Similar to element 204a, shim electrode 206a is divided into two electrically isolated regions. In FIG. 2D an insulative region 206a3 divides conductive region 206a1 from conductive region 206a2.

Figure 3A:
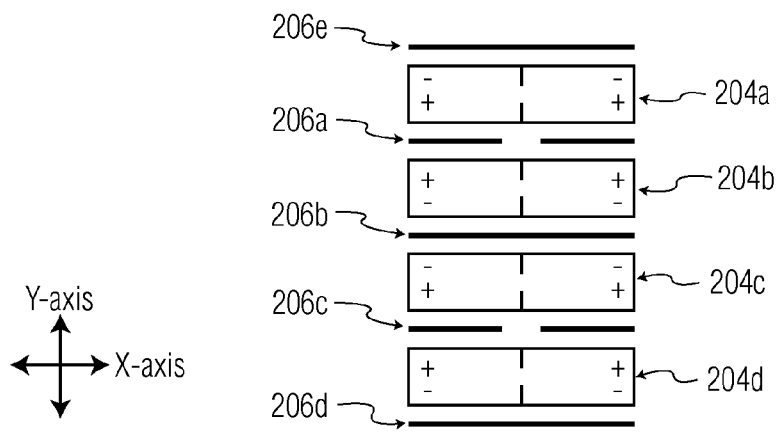
FIGS. 3A-3C and FIG. 4A are block diagram views of piezoelectric element stacks for use in a transducer in accordance with exemplary embodiments of the present invention.
Figure 3B:
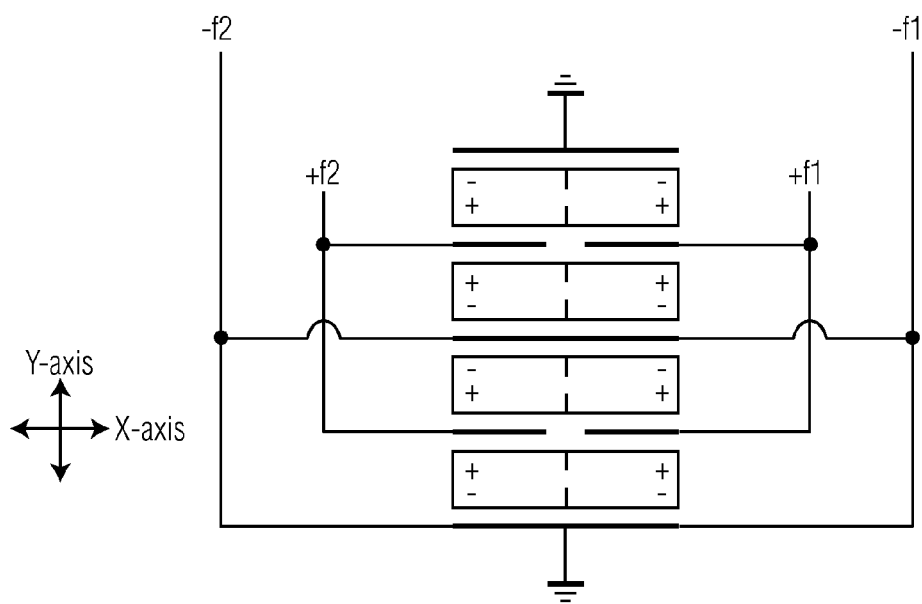
Figure 3C:
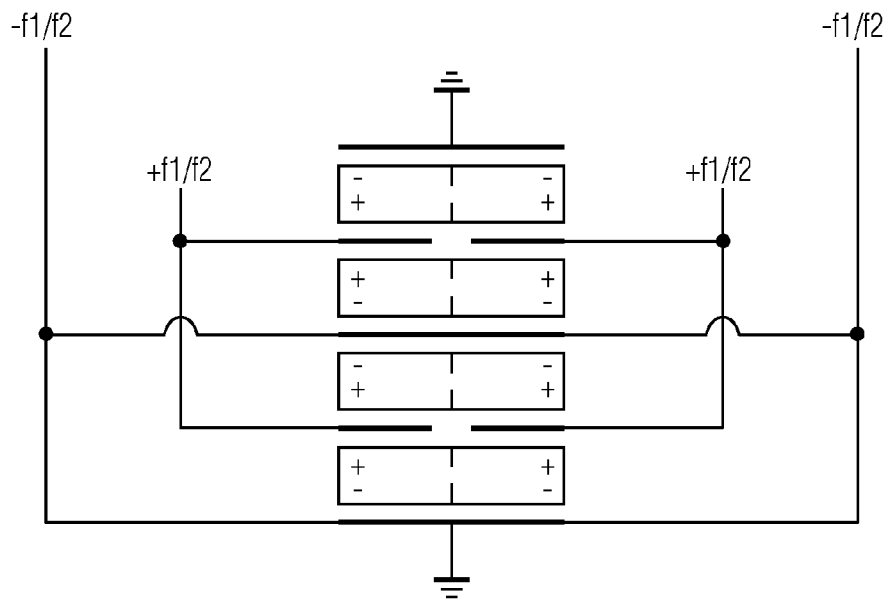

FIG. 3A is a top view block diagram illustration of a stack of piezoelectric elements which could be arranged in an aperture of a transducer (similar to the arrangement of elements 104a, 104b, 104c, and 104d in the aperture of transducer 100 in FIG. 1). The stack includes element 204a from FIGS. 2A-2C, and three similar elements 204b, 204c, and 204d. Each of elements 204a, 204b, 204c, and 204d have their respective electrodes divided as is illustrated at the center region of each element. The stack also includes shim electrode 206a from FIG. 2D, as well as shim electrodes 206b, 206c, 206d, and 206e. In this particular configuration, only the positive shim electrodes are split (i.e., 206a and 206c), and the negative shim electrodes are all electrically bonded together (e.g., to ground). FIGS. 3B and 3C are two different examples of how the stack of FIG. 3A could be connected to electrical signals. Referring specifically to FIG. 3B, a first frequency f1 is electrically coupled to the right hand portion of the stack, while second frequency f2 is electrically coupled to the left hand portion of the stack. Of course, f1 and f2 may be any desired frequencies given the application, transducer, and the desired scrub. Exemplary frequencies for f1 and f2 are 115 kHz and 120 kHz. As is shown in FIG. 3B, the positive connection for frequency f1 (+f1) is electrically coupled to the right hand portions of shim electrodes 206a and 206c. Likewise, the negative connection for frequency f1 (−f1) is electrically coupled to shim electrodes 206b, 206d, and 206e. The positive connection for frequency f2 (+f2) is electrically coupled to the left hand portions of shim electrodes 206a and 206c. Likewise, the negative connection for frequency f2 (−f2) is electrically coupled to shim electrodes 206b, 206d, and 206e. By applying these two frequencies f1, f2 to the respective piezoelectric element regions simultaneously, a non-linear scrub is applied at the tip of the bonding tool coupled to the transducer.

FIG. 3C is another exemplary configuration of the crystal stack of FIG. 3A. In contrast to FIG. 3B, both frequency f1 and f2 (+f1/f2, −f1/f2) are applied to both the left hand region and the right hand region of the crystals via the electrodes. These electrical signals, at frequencies f1 and f2, are applied simultaneously; however, the phase configuration of the signals may be changed to achieve the desired result. For example, the signals at frequency f1 at both regions (i.e., the left hand and right hand regions) of the piezoelectric elements may be in phase with one another; however, the signals at frequency f2 at both regions (i.e., the left hand and right hand regions) of the elements may be out of phase with one another (e.g., 180 degrees out of phase with one another) to achieve the desired result. As with FIG. 3B, this configuration may provide a non-linear scrub at the tip of the bonding tool such as a Lissajous type scrubbing motion.

Figure 4A:
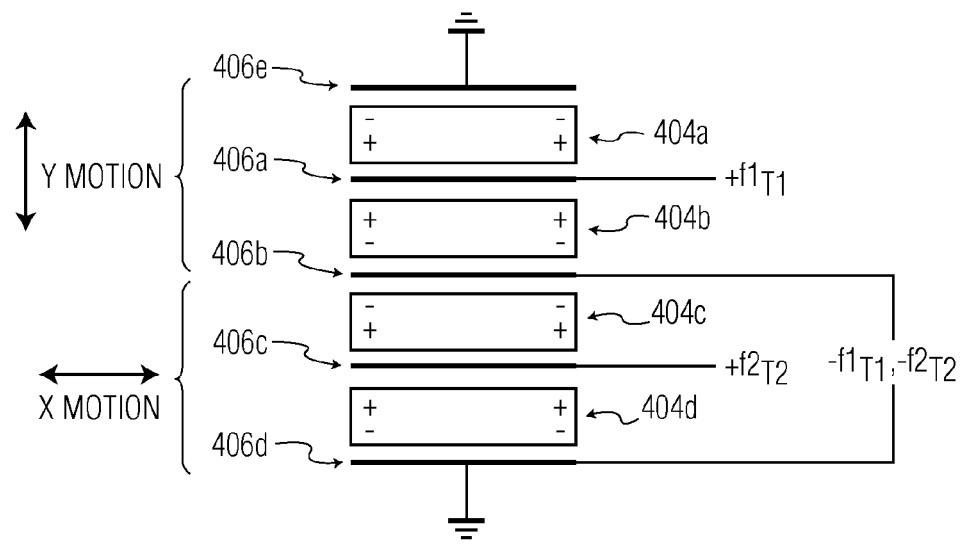

FIG. 4A illustrates another exemplary configuration of piezoelectric elements in a transducer. In this example, the elements are provided such that they deform (e.g., expand, distort, twist, etc.) in differing directions. In this example, elements 404a and 404b (the upper two piezoelectric elements in FIG. 4A) deform such that they collectively provide a scrub of the tip of the bonding tool in a first direction (e.g., the y direction (Y MOTION)), and elements 404c and 404d (the lower two piezoelectric elements in FIG. 4A) are configured to provide a scrub of the tip of the bonding tool in a second direction (e.g., the x direction (X MOTION)) that is different from the first direction. The frequencies applied to the piezoelectric element group (i.e., frequencies f1 and f2) may be different or they may be the same.

In the following description related to FIGS. 4A-4J (and applicable to other drawings as well), it should be understood that piezoelectric element deformation (e.g., expansion, distortion, etc.) in a given direction does not necessarily equate with scrubbing of the tip of the bonding tool in that direction. Rather, use of piezoelectric elements that deform in differing directions (e.g., in combination with other features such as split piezoelectric elements, split piezoelectric element electrodes, etc.) efficiently enables desired modes of transducer operation. For example, by applying electrical energy at two resonant frequencies inherent to a transducer (to a single driver of that transducer) a desired non-linear scrubbing motion of the bonding tool tip may be achieved. It shall be appreciated that the electrical energy at the two resonant frequencies may be applied to different portions of the driver (e.g., to elements which deform in differing directions) as illustrated and described herein.

In the illustrated example, the upper two piezoelectric elements collectively provide a Y scrub of the bonding tool tip (i.e., along axis "A" shown in FIG. 1), while the lower two piezoelectric elements collectively provide an X scrub of the bonding tool tip (i.e., perpendicular to axis "A" shown in FIG. 1). It is understood that in this example, element 404a may not provide the Y scrub by itself, but collectively, elements 404a and 404b efficiently excite the Y scrub vibrational mode of the transducer. Additionally, it is understood that the scrub directions are not limited to X and Y (where the X and Y directions are perpendicular to one another) but could be any two directions that are different from one another. Of course, in many conventional wire bonding applications bond pads on a die and corresponding leads on a leadframe tend to be aligned along one of the X-axis and the Y-axis, so such an arrangment may be particularly desirable.

Figure 4B:
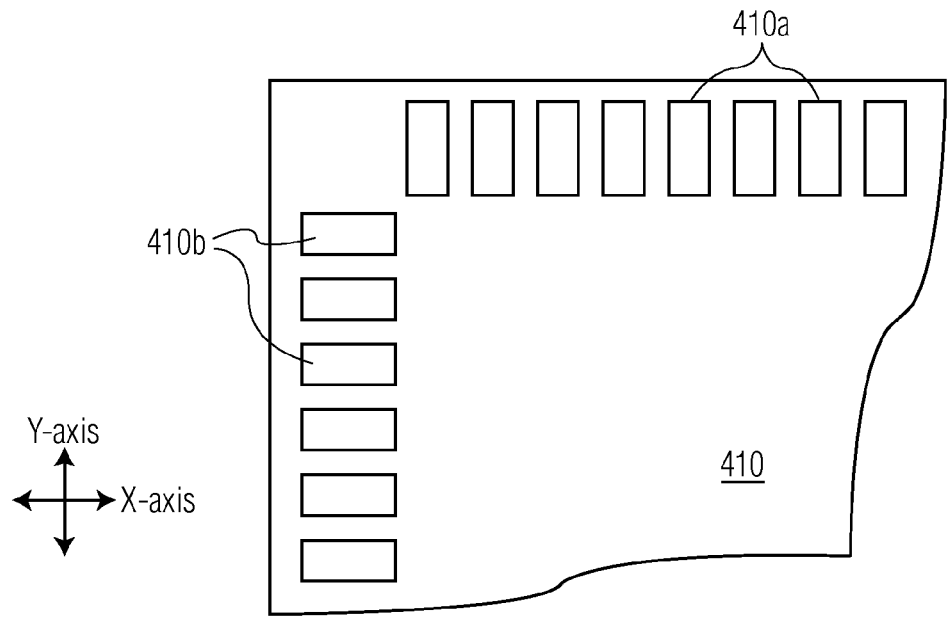
FIG. 4B is a block diagram view of a portion of a device to be wire bonded using transducers in accordance with exemplary embodiments of the present invention.

FIG. 4B illustrates a portion of exemplary semiconductor device 410 (e.g., a semiconductor die 410, a leadframe 410, etc.). Device 410 includes a first plurality of bonding locations 410a (e.g., bond pads 410a, leads 410a, etc.) arranged in a row, and a second plurality of bonding locations 410b (e.g., bond pads 410b, leads 410b, etc.) arranged in a column that is generally perpendicular to the row of bonding locations 410a. As made clear in FIG. 4B, the shape of bonding locations 410a, 410b is not square, but rather, is rectangular. In such a case, it may be desirable to form wire bonds on the bonding locations 410a, 410b using scrubbing motions that depend on the shape of the given bonding location. That is, when bonding a portion of wire to bonding location 410a (e.g., to form a wire bond of a wire loop, such as a first bond or a second bond of the wire loop) it may be desired to configure the transducer to provide scrubbing of the bonding tool tip along the Y-axis (e.g., see the legend). Likewise, when bonding a portion of wire to bonding location 410b it may be desired to configure the transducer to provide scrubbing of the bonding tool tip along the X-axis.

Of course, the shape of the bonding locations is not the only reason to vary the scrubbing direction. Another exemplary reason relates to die pad splash or related problems. As will be understood by those skilled in the art, semiconductor device manufacturers continue to strive to reduce the size of devices, and as such, they strive to reduce the spacing between bonding locations (e.g., between adjacent die pads). However, such reduced spacing between bonding locations increases the potential for pad splash causing electrical shorting. The potential for such pad splash shorting is made worse still, for example, when copper wire is used to form the wire bonds due to the work hardening of a copper. Again, referring to FIG. 4B, when bonding a portion of wire to bonding location 410a it may be desired to configure the transducer to provide scrubbing of the bonding tool tip along the Y-axis such that the scrubbing is not in the direction of an adjacent bonding location 410a (where bonding locations 410a are arranged in a row along the X-axis), thereby reducing the potential for pad splash with adjacent bonding locations 410a. Likewise, when bonding a portion of wire to bonding location 410b, by configuring the transducer to provide scrubbing of the bonding tool tip along the X-axis such that the scrubbing is not in the direction of an adjacent bonding location 410b (where bonding locations 410b are arranged in a column along the Y-axis), the potential for pad splash with adjacent bonding locations 410b is reduced.

Referring now to the electrical connections in FIG. 4A, the positive connection for first frequency f1 is provided to the positive electrode of elements 404a and 404b (i.e., the electrode labelled 406a in FIG. 4A), and the negative connection for first frequency f1 is provided to the negative electrode of elements 404a, 404b (i.e., by bonding of the negative electrodes to ground). Likewise, the positive connection for second frequency f2 is provided to the positive electrode of elements 404c and 404d (i.e., the electrode labelled 406c in FIG. 4A), and the negative connection for second frequency f2 is provided to the negative electrode of element 404c, 404d (i.e., by bonding of the negative electrodes to ground). Of course, the negative connections for both frequencies may be bonded together, and grounded, as illustrated (i.e., the connections to electrodes 406b, 406d, and 406e, may be bonded together, and coupled to ground if desired).

In FIG. 4A, frequency signal f1 is labelled as $f1_{T1}$, and frequency signal f2 is labelled as $f2_{T2}$ where "T" is time. This is because the electrical signals at frequencies f1 and f2 may not be applied simultaneously. Of course, the signals could be applied simultaneously, but in the example presently described they are sequentially applied as will be described in the operational sequence below.

Now an exemplary, non-limiting, operational sequence is described for FIG. 4A. In this exemplary application, let us assume that we are bonding wire loops between a conventional die (with bond pads in a square configuration around the periphery of the die) and a leadframe supporting the die (with leads in a square configuration). In such an example, wire loops may be extended in one of two directions, that is, along the X-axis or the Y-axis. It may be desirable that the wire bonds (e.g., the first bonds and/or second bonds) of the wire loops formed along the X-axis be formed with an X-axis scrub (X MOTION), and that the wire bonds of the wire loops formed along the Y-axis be formed with a Y-axis scrub (Y MOTION). Referring now to FIG. 4A, when forming the first groups of wire loops along the Y-axis, electrical energy at frequency f1 is applied at time T1 (i.e., $ft_{T1}$). As described above, the application of this electrical energy desirably results in the Y-axis scrub of the bonding tool tip. After the first group of wire loops is formed, the second group of wire loops is to be formed along the X-axis. In forming this second group of wire loops, electrical energy at frequency f2 is applied at time T2 (i.e., $f2_{T2}$). As described above, the application of this electrical energy desirably results in the X-axis scrub of the bonding tool tip. While this example has been described in connection with two groups of wire loops along the X-axis and Y-axis respectively, other alternatives are contemplated. For example, more than two groups of wire loops may be formed (e.g., first wire loops along the Y-axis using f1, then wire loops along the X-axis using f2, then wire loops along the Y-axis again using f1, etc.). Further, the direction of tool tip scrub may be different than just X-axis or Y-axis scrub. For example, additional or different scrubs are possible (e.g., by providing crystals that deform in different directions, at the same or different frequencies, to generate additional or different tool tip scrub directions).

Further still, during formation of a single wire bond (e.g., a ball bond, a stitch bond, etc.) scrubbing along more than one direction may be employed. For example, scrubbing along the X-axis may be used, followed by scrubbing along the Y-axis, during formation of the same wire bond. Of course, other scrubbing directions are contemplated.

It is understood that the order of the piezoelectric elements used to generate the first scrub and the second scrub may be different from that illustrated in FIG. 4A. More specifically, in FIG. 4A, the upper two elements (404A, 404B) collectively generate the Y-axis scrub, and the lower two elements (404C, 404D) generate the X-axis scrub. However, the invention is not so limited. Any combination of piezoelectric elements may be used to generate the desired scrub (e.g., the first and third elements could generate a first scrub, while the second and fourth elements could generate a second different scrub). Likewise, different numbers of piezoelectric elements may be provided in the transducer.

Additionally, while not shown in FIG. 4A, if desired to achieve a specific result, the piezoelectric element electrodes in the configuration of FIG. 4A may be split as are elements 204a, 204b, 204c, 240d shown in FIG. 3A. Further, the electrical energy at the multiple frequencies may be applied simultaneously where T1=T2 (instead of sequentially). Further still, the electrical energy at the multiple frequencies may be applied to each group of crystals, with or without a phase shift between certain of the frequencies.

Figure 4C:
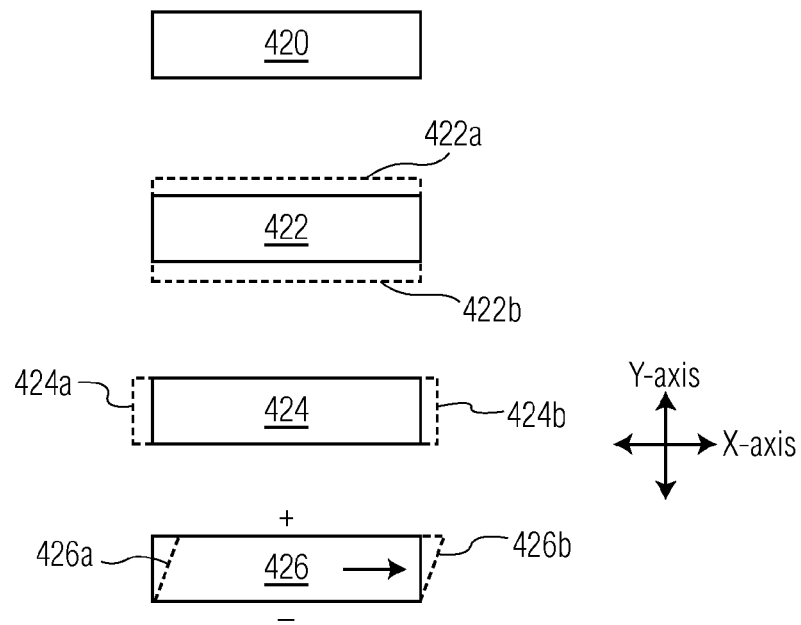
FIG. 4C includes a plurality of block diagram views of piezoelectric elements useful in transducers in accordance with exemplary embodiments of the present invention.

As provided above with respect to FIG. 4A, the piezoelectric elements in a given piezoelectric element stack (where the stack is a single driver of a transducer such as transducer 100 in FIG. 1) are provided such that they deform in differing directions. FIG. 4C illustrates four elements 420, 422, 424, and 426. Element 420 is a piezoelectric element in a non-energized state, illustrated for reference only. Element 422 is a piezoelectric element that deforms in the y direction (e.g., expands in the y direction, along the Y-axis of a wire bonding machine), and as such, during application of electrical energy, the element deforms in the y direction to include deformed areas 422a and 422b. Element 424 is a piezoelectric element that deforms in the x direction (e.g., expands in the x direction, along the X-axis of a wire bonding machine), and as such, during application of electrical energy, the element deforms in the x direction to include deformed areas 424a and 424b. Element 426 is a piezoelectric element that deforms in an XY shear direction (e.g., distorts in the XY shear direction of a wire bonding machine), and as such, during application of electrical energy, the element deforms in the XY shear direction to include deformed areas 426a and 426b. Element 426 also illustrates an exemplary polarity and a corresponding XY shear deformation direction indicated by an arrow in element 426. As will be appreciated by those skilled in the art, piezoelectric elements that deform in differing directions may be combined in a single driver of a transducer (e.g., in a single piezoelectric element stack). In order to provide the desired effect (e.g., a given non-linear scrub of the bonding tool tip, selective linear scrub in a first direction for formation of certain wire bonds, and in a second direction for formation of other wire bonds), various features may be varied, for example: the transducer design; a driver including piezoelectric elements that deform in different directions; application of multiple frequencies simultaneously to the driver piezoelectric elements; application of multiple frequencies sequentially; split piezoelectric element electrodes; amongst others.

FIGS. 4D-4J illustrate a number of exemplary configurations combining piezoelectric elements that deform in different directions. In FIGS. 4D-4J piezoelectric elements labelled "Y" are elements that are configured to deform in the y direction, and piezoelectric elements labelled "XY SHEAR" are elements configured to deform in the XY shear direction. Unless indicated otherwise, in any of the examples illustrated in FIGS. 4D-4J, electrical energy at frequency f1 and f2 may be provided simultaneously, separately, and/or sequentially, as desired, to achieve the desired bonding tool tip scrub. The piezoelectric element stack configuration illustrated in FIGS. 4D-4J may be used, for example, to achieve a desired non-linear tool tip scrub, a selective linear tool tip scrub (scrubbing along the X-axis for certain bonding locations, and scrubbing along the Y-axis for other bonding locations, scrubbing sequentially along one of the x & y directions, and then the other of the x & y directions, in the same wire bond), etc.

Figure 4D:
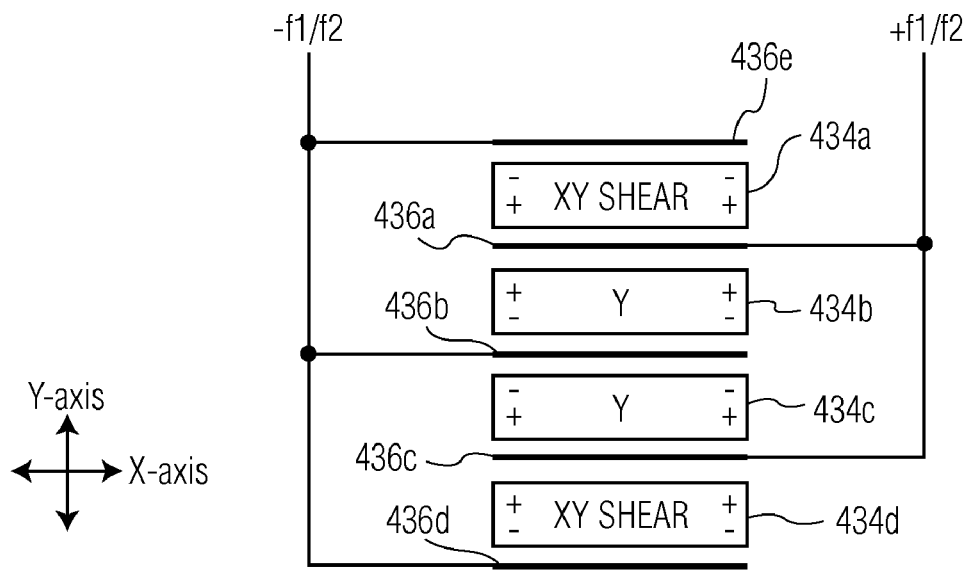
FIGS. 4D-4J are block diagram views of piezoelectric element stacks for use in a transducer in accordance with exemplary embodiments of the present invention.

FIG. 4D illustrates a driver for use in a transducer including a stack of elements 434a (a piezoelectric element that deforms in the XY shear direction), 434b (a piezoelectric element that deforms in the Y direction), 434c (a piezoelectric element that deforms in the Y direction), and 434d (a piezoelectric element that deforms in the XY shear direction), where elements 434a, 434b are separated by shim electrode 436a; elements 434b, 434c are separated by shim electrode 436b; elements 434c, 434d are separated by shim electrode 436c; shim electrode 436d is adjacent element 434d; and shim electrode 436e is adjacent element 434a. The positive connection for both frequencies f1, f2 (+f1/f2) is provided to the positive electrode of elements 434a and 434b (i.e., the shim electrode labelled 436a in FIG. 4D), and to the positive electrode of elements 434c and 434d (i.e., the shim electrode labelled 436c in FIG. 4D). The negative connection for both frequencies f1, f2 (−f1/f2) is provided to the negative electrode of elements 434a, 434b, 434c, and 434d (i.e., the shim electrodes labelled 436b, 436d, and 436e in FIG. 4D), and may be grounded as desired. Electrical energy at frequency f1 and f2 may be provided simultaneously, separately, and/or sequentially, as desired, to achieve the desired bonding tool tip scrub. The piezoelectric element stack configuration illustrated in FIG. 4D may be used, for example, to achieve a desired non-linear tool tip scrub, a selective linear tool tip scrub (i.e., scrubbing along the x-axis for certain bonding locations, and scrubbing along the y-axis for other bonding locations), etc.

Figure 4E:
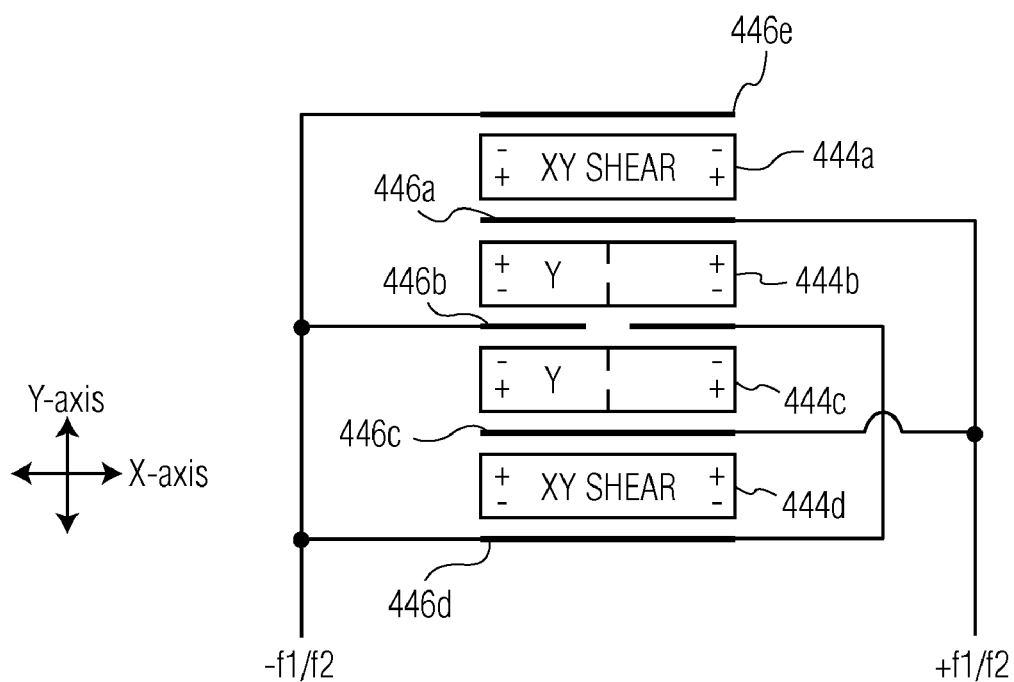

FIG. 4E illustrates a driver for use in a transducer including a stack of piezoelectric elements 444a, 444b, 444c, and 444d, where elements 444a, 444b are separated by shim electrode 446a; elements 444b, 444c are separated by shim electrode 446b; elements 444c, 444d are separated by shim electrode 446c; shim electrode 446d is adjacent element 444d; and shim electrode 446e is adjacent element 444a. Elements 444b, 444c have their electrodes split, and shim electrode 446b is a split shim electrode. The positive connection for both frequencies f1, f2 (+f1/f2) is provided to shim electrodes 446a, 446c. The negative connection for both frequencies f1, f2 is provided to electrodes 446d, 446e, to the left hand portion of shim electrode 446b, and to the right hand portion of shim electrode 446b, where the negative connections may be grounded as desired. In such an example, shim electrode 446b is split with separate ground wires allowing for independent current flow from either side of the piezoelectric element.

Figure 4F:
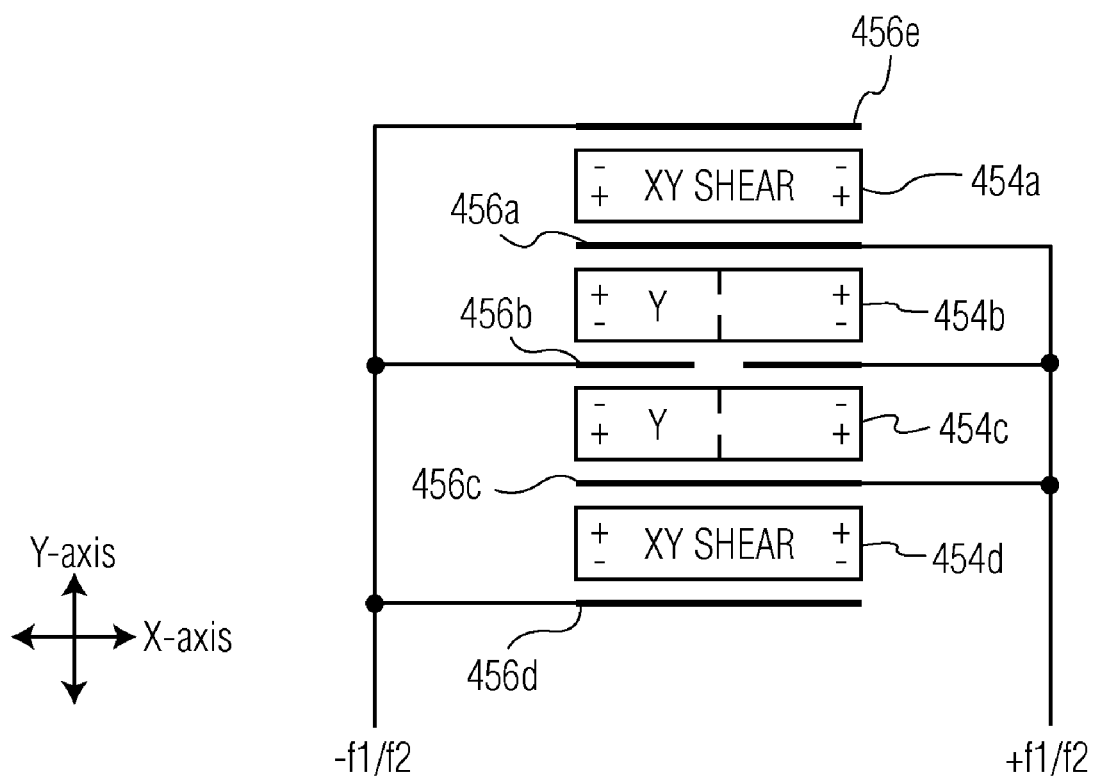

FIG. 4F illustrates a driver for use in a transducer including a stack of piezoelectric elements 454a, 454b, 454c, and 454d, where elements 454a, 454b are separated by shim electrode 456a; elements 454b, 454c are separated by shim electrode 456b; elements 454c, 454d are separated by shim electrode 456c; shim electrode 456d is adjacent element 454d; and shim electrode 456e is adjacent element 454a. Elements 454b, 454c have their electrodes split, and shim electrode 456b is a split electrode. The positive connection for both frequencies f1, f2 (+f1/f2) is provided to shim electrodes 456a, 456c, and to the right hand portion of split shim electrode 456b. The negative connection for both frequencies f1, f2 (−f1/f12) is provided to shim electrodes 456d, 456e, and to the left hand portion of shim electrode 456b, where the negative connections may be grounded as desired. In such an example, the shorting of both of the right side electrodes (positive and negative) of element 454c substantially eliminates the output for both f1/f2 modes.

While the embodiments described thus far have included 4 piezoelectric elements (e.g., piezoelectric crystals, piezoelectric ceramics, etc.) in a driver stack, the invention is not so limited. In fact, any number of elements may be included in a driver, as desired in the given application. In FIGS. 4G-4J, eight piezoelectric elements are provided in each driver stack. In FIGS. 4G-4J, none of the elements have their electrodes split, and none of the electrodes are split; however, it is understood that in certain implementations of the invention such elements may have their electrodes split, and such electrodes may be split, as desired.

Figure 4H:
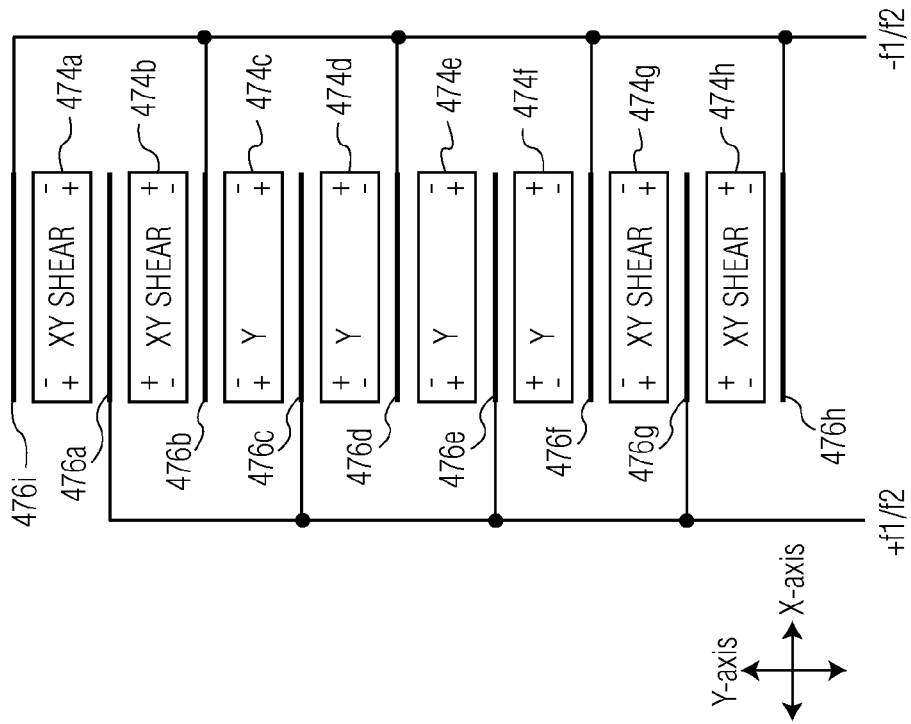
Figure 4G:
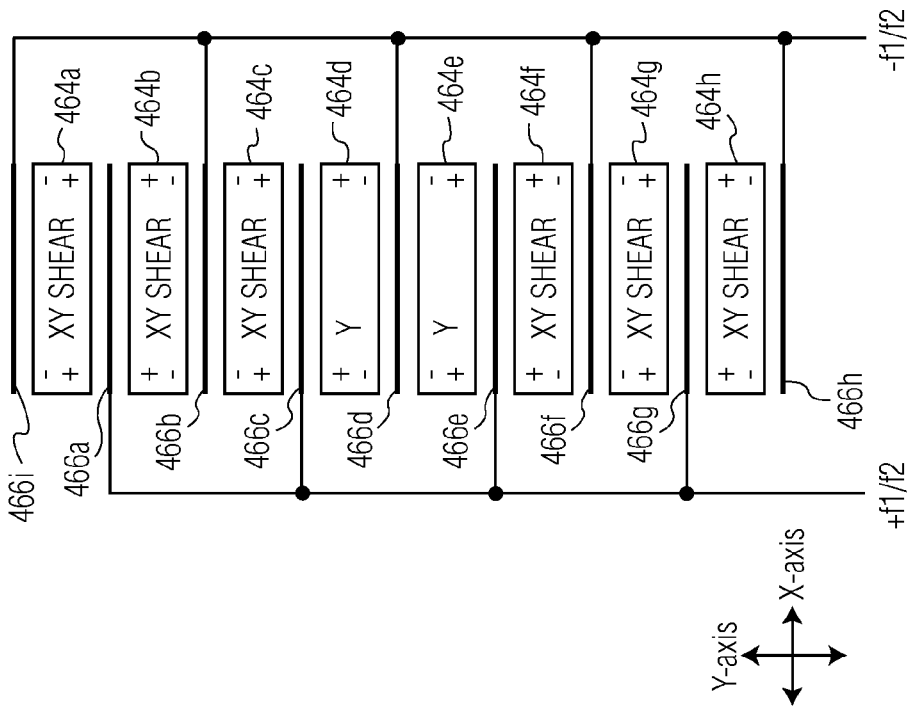

FIG. 4G illustrates a driver for use in a transducer including a stack of piezoelectric elements 464a, 464b, 464c, 464d, 464e, 464f, 464g, and 464h. Elements 464a, 464b are separated by shim electrode 466a; elements 464b, 464c are separated by shim electrode 466b; elements 464c, 464d are separated by shim electrode 466c; elements 464d, 464e are separated by shim electrode 466d; elements 464e, 464f are separated by shim electrode 466e; elements 464f, 464g are separated by shim electrode 466f; elements 464g, 464h are separated by shim electrode 466g; shim electrode 466h is adjacent element 464h; and shim electrode 466i is adjacent element 464a. The positive connection for both frequencies f1, f2 (+f1/f2) is provided to the shim electrodes 466a, 466c, 466e, and 466g. The negative connection for both frequencies f1, f2 (−f1/f2) is provided to shim electrodes 466b, 466d, 466f, 466h, and 466i, where the negative connections may be grounded as desired.

FIG. 4H illustrates a driver for use in a transducer including a stack of piezoelectric elements 474a, 474b, 474c, 474d, 474e, 474f, 474g, and 474h. Elements 474a, 474b are separated by shim electrode 476a; elements 474b, 474c are separated by shim electrode 476b; elements 474c, 474d are separated by shim electrode 476c; elements 474d, 474e are separated by shim electrode 476d; elements 474e, 474f are separated by shim electrode 476e; elements 474f, 474g are separated by shim electrode 476f; elements 474g, 474h are separated by shim electrode 476g; shim electrode 476h is adjacent element 474h; and shim electrode 476i is adjacent element 474a. The positive connection for both frequencies f1, f2 (+f1/f2) is provided to the shim electrodes 476Aa, 476c, 476e, and 476g. The negative connection for both frequencies f1, f2 (+−f1/f2) is provided to shim electrodes 476b, 476d, 476f, 476h, and 476i, where the negative connections may be grounded as desired.

Figure 4J:
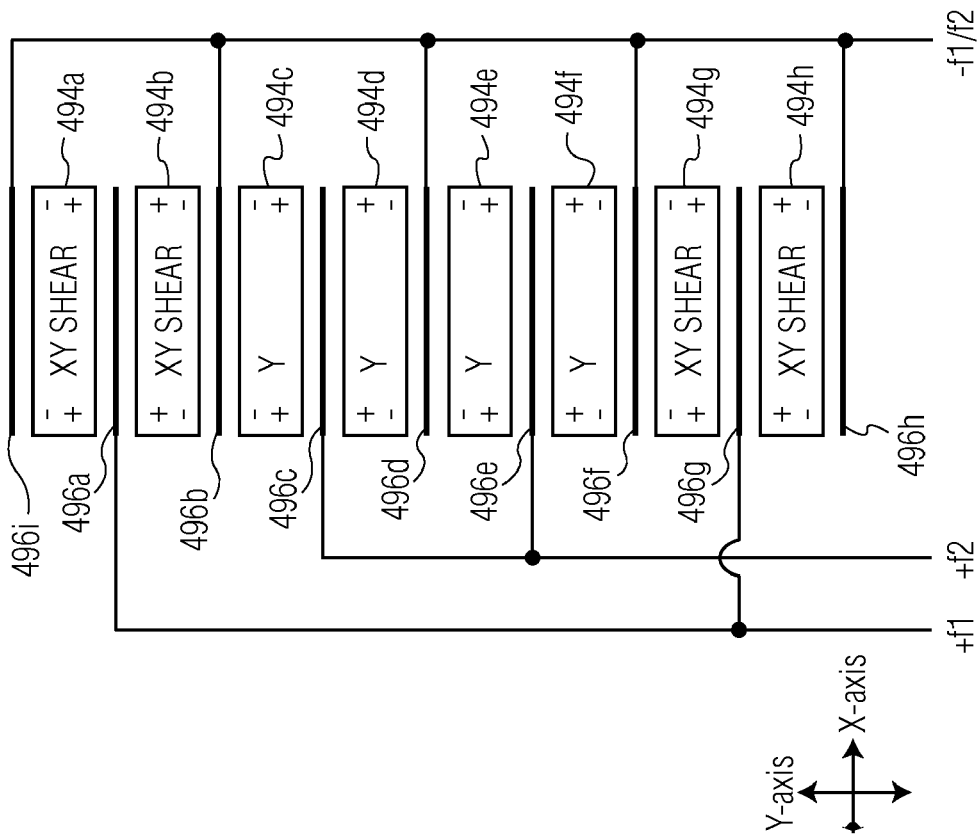
Figure 4I:
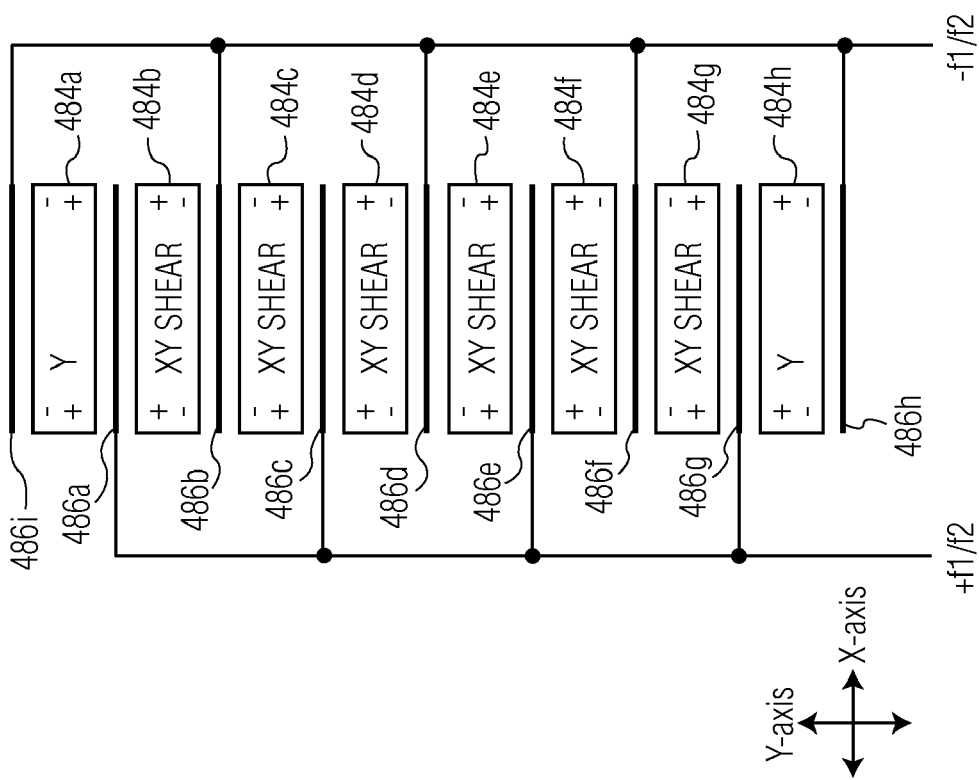

FIG. 4I illustrates a driver for use in a transducer including a stack of piezoelectric elements 484a, 484b, 484c, 484d, 484e, 484f, 484g, and 484h. Elements 484a, 484b are separated by shim electrode 486a; elements 484b, 484c are separated by shim electrode 486b; elements 484c, 484d are separated by shim electrode 486c; elements 484d, 484e are separated by shim electrode 486d; elements 484e, 484f are separated by shim electrode 486e; elements 484f, 484g are separated by shim electrode 486f; elements 484g, 484h are separated by shim electrode 486g; shim electrode 486h is adjacent element 484h; and shim electrode 486i is adjacent element 484a. The positive connection for both frequencies f1, f2 (+f1/f2) is provided to the shim electrodes 486a, 486c, 486e, and 486g. The negative connection for both frequencies f1, f2 (−f1/f2) is provided to shim electrodes 486b, 486d, 486f, 486h, and 486i, where the negative connections may be grounded as desired.

FIG. 4J illustrates a driver for use in a transducer including a stack of piezoelectric elements 494a, 494b, 494c, 494d, 494e, 494f, 494g, and 494h. Elements 494a, 494b are separated by shim electrode 496a; elements 494b, 494c are separated by shim electrode 496b; elements 494c, 494d are separated by shim electrode 496c; elements 494d, 494e are separated by shim electrode 496d; elements 494e, 494f are separated by shim electrode 496e; elements 494f, 494g are separated by shim electrode 496f; elements 494g, 494h are separated by shim electrode 496g; shim electrode 496h is adjacent crystal 494h; and shim electrode 496i is adjacent element 494a. The positive connection for frequency f1 (+f1) is provided to the electrodes 496a and 496g. The positive connection for frequency f2 (+f2) is provided to the shim electrodes 496c and 496e. The negative connection for both frequencies f1, f2 (−f1/f2) is provided to shim electrodes 496b, 496d, 496f, 496h, and 496i, where the negative connections may be grounded as desired.

Figure 5A:
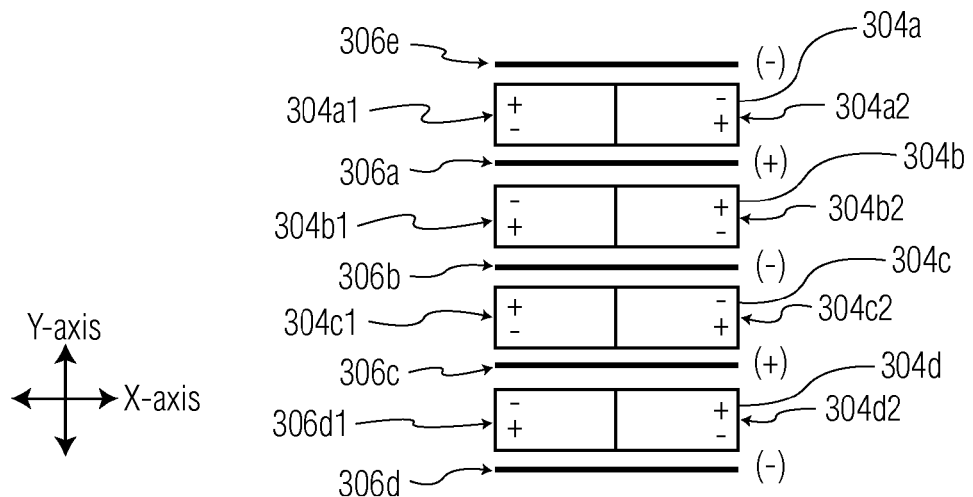
FIGS. 5A-5B are views of another piezoelectric element stack for use in a transducer in accordance with an exemplary embodiment of the present invention.
Figure 5B:
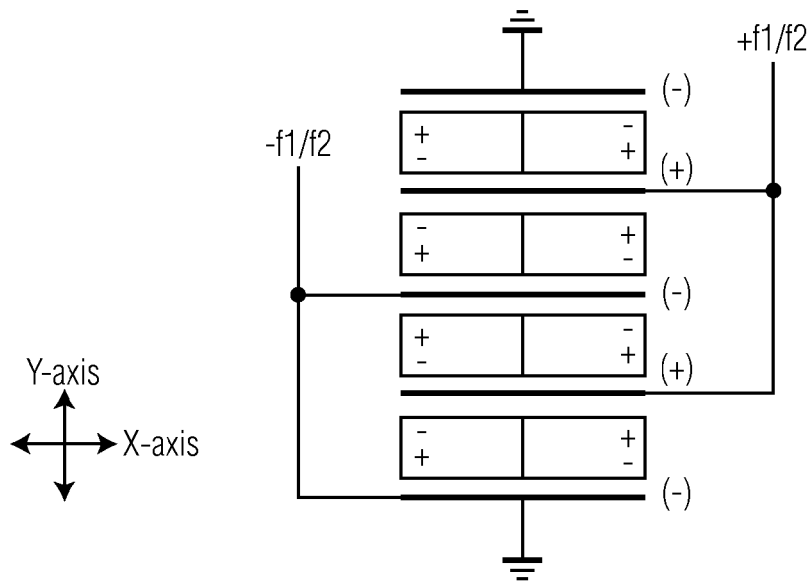

Certain apects of the present invention have been described in connection with piezoelectric elements having split electrodes (such as FIGS. 2A-2C and 3A-3C), but the piezoelectric element body is not split. However, in certain exemplary embodiments of the present invention, the entire piezoelectric element body may be split in two (or more) pieces. For example, in the illustration provided in FIGS. 5A-5B, each piezoelectric element has been split (as indicated by the solid centerline on each element). That is, element 304a has been split into 304a1 and 304a2, etc. Additionally, the left hand portion of each element has been "flipped" around. For example, element portion 304a1 (and element portions 304b1, 304c1, and 304d1) has been flipped. Thus, by viewing the polarity markings (the "+" and "−" symbols) in FIG. 5A, it is clear that the right hand portion of each piezoelectric element is reversed in comparison to the left hand portion of each element. FIG. 5B also illustrates an exemplary electrical connection for the stack of FIG. 5A whereby the positive connection for f1 and f2 (+f1/f2) is coupled to two of the shim electrodes (306a, 306c), while the negative connection for f1 and f2 (−f1/f2) are coupled to others of the electrodes (306b, 306d, and 306e via a ground connection if desired). Thus, in this example, electrical energy at both frequencies is provided simultaneously. In any event, the configuration illustrated in FIGS. 5A-5B provides a non-linear scrub to the bonding tool tip.

Figure 6A:
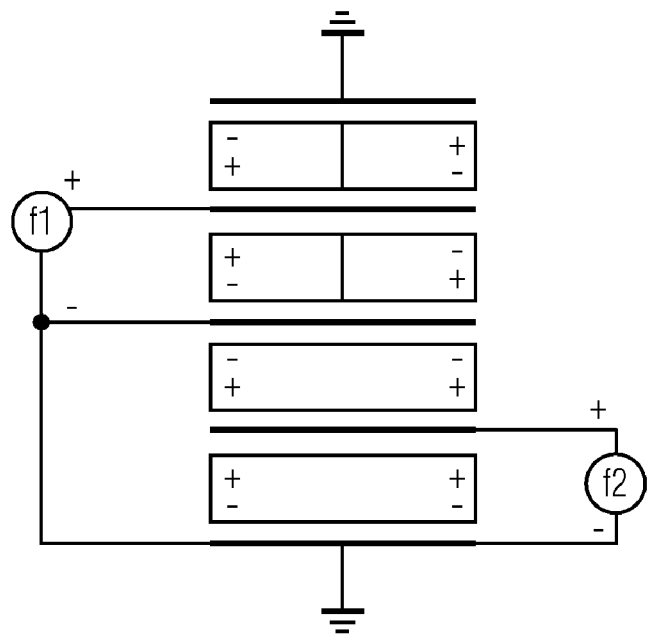
FIGS. 6A-6B are two views of additional configurations of a piezoelectric element stack for use in a transducer in accordance with additional exemplary embodiments of the present invention.
Figure 6B:
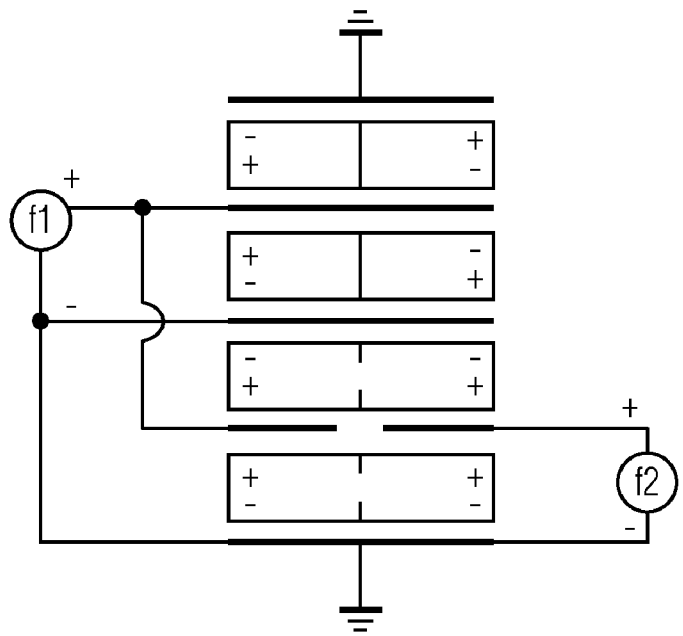

FIGS. 6A and 6B are additional exemplary embodiments of the present invention which combine certain of the aforementioned concepts. Referring specifically to FIG. 6A, the upper two piezoelectric elements are split (with the left hand portions flipped). A first frequency f1 (e.g., 115 kHz) is applied and generates a tool tip scrub in a first direction (e.g., along the X-axis). The lower two piezoelectric elements are standard elements (i.e., they have not been split, and their electrodes have not been split), and a second frequency f2 (e.g., 120 kHz) is applied and generates a tool tip scrub in a second direction (e.g., along the Y-axis). This arrangement may have certain benefits, for example, it completely uncouples the f1 and f2 modes (i.e., the back EMF cancels in each case). More specifically, when the upper portion is driven at frequency f1, the lower piezoelectric elements will not produce a back EMF charge at f1 because the charge cancels when the left side of the crystal deforms out of phase with the right side of the piezoelectric element. When the bottom portion is driven at frequency f2, the back EMF at f2 cancels in the top two piezoelectric elements since the charge cancels when the left and right sides move in phase.

FIG. 6B is yet another exemplary configuration. In FIG. 6B, the upper piezoelectric elements are split as in FIG. 6A, and now the lower two piezoelectric elements have split electrodes (as in FIGS. 2A-2C and 3A-3C). Additionally, the electrode between the third and fourth piezoelectric elements is split (i.e., has two electrically isolated regions). Of course, FIG. 6B is just one of a number of variations of the teachings of the present invention.

Figure 7A:
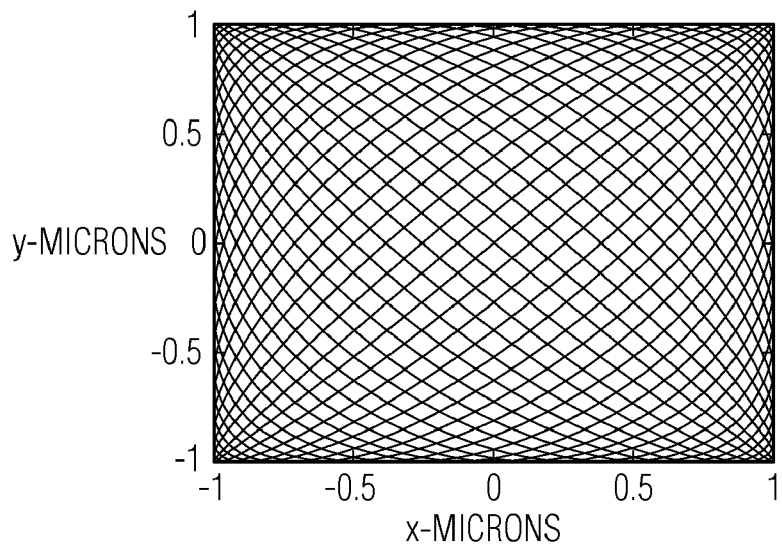
FIGS. 7A-7C are diagrams of scrub patterns of bonding tool tips in accordance with exemplary embodiments of the present invention.
Figure 7B:
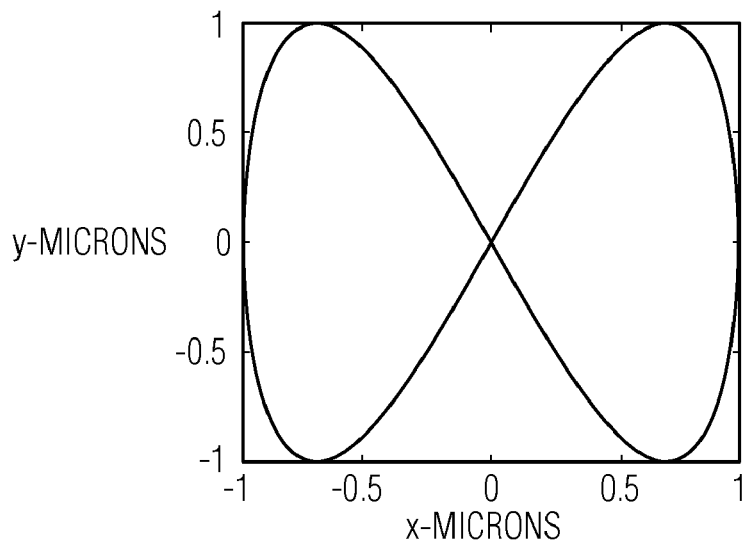
Figure 7C:
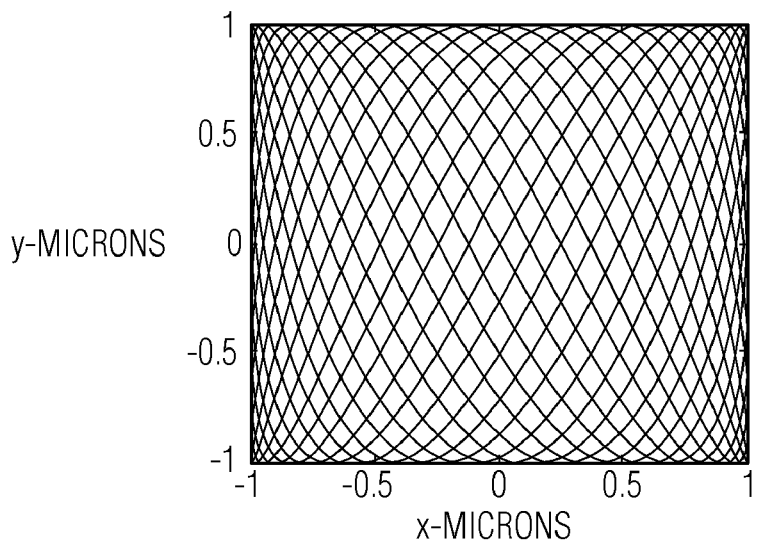

FIGS. 7A-7C illustrate non-linear scrub patterns of a bonding tool tip generated by a transducer/operating technique of the present invention. As described above, various exemplary embodiments of the present invention are drawn to providing a non-linear scrub of the bonding tool tip. A Lissajous scrub pattern is an example of such a scrub pattern and may include circular scrub patterns, elliptical scrub patterns, or mesh shaped scrub patterns. Of course, other non-linear scrub patterns are contemplated.

The present invention is primarily described in connection with a piezo stack of four or eight piezoelectric elements, and two frequencies applied thereto (e.g., f1 and f2, or f1/f2). It is understood that different stack arrangement (with more or less piezoelectric elements) and different frequencies (e.g., more than two electrical signals, such as the inclusion of a third signal at frequency f3) are contemplated.

Various aspects of the present invention are described in connection with "split" piezoelectric elements and split piezoelectric element "electrodes." It is understood that the structures (e.g., the piezoelectric elements, the piezoelectric element electrodes, the shims electrodes, etc.) may be physically altered (e.g., cut) to provide the desired electrical isolation. However, the splitting may be provided in other ways such as when the structures are first manufactured they may be provided with the desired electrically isolated regions. Further, as will be understood by those skilled in the art, the "poling" of the piezoelectrioc elements (e.g., giving the elements their polarity, for example, by applying a relatively high voltage such as 2,000 volts) may be accomplished prior to, during, or after the splitting of the elements or the splitting of the electrodes of the elements.

While the present invention has primarily been described in connection with transducers for providing non-linear scrubbing of a bonding tool tip, and for providing selective linear scrubbing of a bonding tool tip, it is not limited thereto. Certain of the teachings of the present invention may be used in connection with: (1) scrubbing motions having non-planar components (e.g., where at least a portion of the motion is not in the XY plane, but is rather along the vertical Z-axis—see the legend in FIG. 1, e.g.); and (2) torsional/spining motions of the bonding tool tip (with or without scrubbing motions), amongst others.

While certain exemplary embodiments of the present invention have been described in connection with piezoelectric elements (e.g., crystals, ceramics, etc.) split into two pieces, piezoelectric element electrodes split into two pieces, and shim electrodes (e.g., shims) split into two pieces, it is understood that any of these may be divided into two or more regions. That is, piezoelectric elements, piezoelectric element electrodes, and shim electrodes may be divided into two or more electrically isolated regions as desired in the given application.

Although the present invention has been illustrated and described primarily with respect to ultrasonic transducers for use in wire bonding machines it is not limited thereto. For example, the teachings of the present invention (e.g., including piezoelectric element configurations, split elements, split element electrodes, stack arrangements, etc.) may be applied to ultrasonic transducers for use in any of a number of applications such as ultrasonic imaging, ultrasonic sensors, ultrasonic welders, ultrasonic motors, amongst others.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A transducer for use in a wire bonding operation, the transducer comprising:
   (a) an elongated body portion including an aperture configured to receive a bonding tool; and
   (b) a driver for providing vibration to the elongated body portion, the driver including a plurality of piezoelectric elements, each of the plurality of piezoelectric elements being separated into at least two regions electrically isolated from one another.

2. A transducer for use in a wire bonding operation, the transducer comprising:
   (a) an elongated body portion configured to support a bonding tool; and
   (b) a driver for providing ultrasonic vibration to the elongated body portion, the driver being configured to receive electrical energy and to provide a non-linear scrub of a tip of the bonding tool.

3. A transducer for use in a wire bonding operation, the transducer comprising:
   (a) an elongated body portion configured to support a bonding tool; and
   (b) a driver for providing ultrasonic vibration to the elongated body portion, the driver including at least one piezoelectric element configured to deform in a first direction upon the application of electrical energy, and at least one piezoelectric element configured to deform in a second direction upon the application of electrical energy, the first direction and second direction being different from one another.

4. The transducer of claim 1 wherein electrical energy at a first frequency is configured to be applied to a first of the at least two regions of each of the plurality of piezoelectric elements, and electrical energy at a second frequency is configured to be applied to a second of the at least two regions of each of the plurality of piezoelectric elements.

5. The method of claim 4 wherein the application of the electrical energy to the driver at the first frequency and the second frequency results in a non-linear scrub by a tip of the bonding tool.

6. The transducer of claim 4 wherein the first frequency is approximately 115kHz and the second frequency is approximately 120 kHz.

7. The transducer of claim 4 wherein application of the electrical energy at the first frequency to the first region results in a scrub of a tip of the bonding tool in a first direction, and wherein application of the electrical energy at the second frequency to the second region results in a scrub of the tip of the bonding tool in a second direction, the first direction being different from the second direction.

8. The transducer of claim 7 wherein the first direction extends along an X-axis of a wire bonding machine, and the second direction extends along a Y-axis of the wire bonding machine.

9. The transducer of claim 7 wherein the first direction extends substantially parallel to a longitudinal axis of the transducer, and the second direction extends substantially perpendicular to the longitudinal axis of the transducer.

10. The transducer of claim 7 wherein the first direction is substantially perpendicular to the second direction.

11. The transducer of claim 1 wherein electrical energy at a first frequency and a second frequency is configured to be applied to a first of the at least two regions of each of the plurality of piezoelectric elements, and electrical energy at the first frequency and the second frequency is configured to be applied to a second of the at least two regions of each of the plurality of piezoelectric elements.

12. The transducer of claim 11 wherein the electrical energy applied to the first region and the second region at the first frequency are in phase with one another, and the electrical energy applied to the first region and the second region at the second frequency are out of phase with one another.

13. The transducer of claim 1 wherein the body portion defines a driver aperture, and the plurality of piezoelectric elements are positioned in the driver aperture.

14. The transducer of claim 1 wherein the plurality of piezoelectric elements includes at least one piezoelectric element configured to deform in a first direction upon the application of electrical energy, and at least one piezoelectric element configured to deform in a second direction upon the application of electrical energy, the first direction and second direction being different from one another.

15. The transducer of claim 2 wherein the driver includes a plurality of piezoelectric elements, each of the plurality of piezoelectric elements being separated into at least two regions electrically isolated from one another.

16. The transducer of claim 15 wherein electrical energy at a first frequency is configured to be applied to a first of the at least two regions of each of the plurality of piezoelectric elements, and electrical energy at a second frequency is configured to be applied to a second of the at least two regions of each of the plurality of piezoelectric elements.

17. The transducer of claim 16 wherein the first frequency is approximately 115kHz and the second frequency is approximately 120 kHz.

18. The transducer of claim 16 wherein (1) application of the electrical energy at the first frequency to the first region, without application of the electrical energy at the second frequency to the second region, results in a scrub of the tip of the bonding tool in a first direction, (2) application of the electrical energy at the second frequency to the second region, without application of the electrical energy at the first frequency to the first region, results in a scrub of the tip of the bonding tool in a second direction, the first direction being different from the second direction, and (3) application of the electrical energy at the first frequency to the first region and application of the electrical energy at the second frequency to the second region results in the non-linear scrub of the tip of the bonding tool.

19. The transducer of claim 18 wherein the first direction extends along an X-axis of a wire bonding machine, and the second direction extends along a Y-axis of the wire bonding machine.

20. The transducer of claim 18 wherein the first direction extends substantially parallel to a longitudinal axis of the transducer, and the second direction extends substantially perpendicular to the longitudinal axis of the transducer.

21. The transducer of claim 18 wherein the first direction is substantially perpendicular to the second direction.

22. The transducer of claim 18 wherein electrical energy at the first frequency and the second frequency is configured to be applied to a first of the at least two regions of each of the plurality of piezoelectric elements, and electrical energy at the first frequency and the second frequency is configured to be applied to a second of the at least two regions of each of the plurality of piezoelectric elements.

23. The transducer of claim 22 wherein the electrical energy applied to the first region and the second region at the first frequency are in phase with one another, and the electrical energy applied to the first region and the second region at the second frequency are out of phase with one another.

24. The transducer of claim 2 wherein the non-linear scrub follows a Lissajous pattern.

25. The transducer of claim 2 wherein the non-linear scrub follows a circular pattern.

26. The transducer of claim 2 wherein the non-linear scrub follows an elliptical pattern.

27. The transducer of claim 2 wherein the non-linear scrub follows a mesh-shaped pattern.

28. The transducer of claim 2 wherein the driver includes at least one piezoelectric element configured to deform in a first direction upon application of electrical energy, and at least one piezoelectric element configured to deform in a second direction upon the application of electrical energy, the first direction and the second direction being different from one another.

29. The transducer of claim 28 wherein the first direction is along an X-axis of a wire bonding machine and the second direction is along a Y-axis of the wire bonding machine.

30. The transducer of claim 28 wherein the first direction is along an X-axis of a wire bonding machine and the second direction is an XY shear direction.

31. The transducer of claim 28 wherein the first direction is along an Y-axis of a wire bonding machine and the second direction is an XY shear direction.

32. The transducer of claim 28 wherein the at least one piezoelectric element configured to deform in the first direction deforms in the first direction upon the application of electrical energy at a first frequency, and the at least one piezoelectric element configured to deform in the second direction deforms in the second direction upon the application of electrical energy at a second frequency, the first frequency being different from the second frequency.

33. The transducer of claim 2 wherein the body portion defines a driver aperture, and the plurality of piezoelectric elements are positioned in the driver aperture.

34. The transducer of claim 3 wherein the at least one piezoelectric element configured to deform in the first direction deforms in the first direction upon the application of electrical energy at a first frequency, and the at least one piezoelectric element configured to deform in the second direction deforms in the second direction upon the application of electrical energy at a second frequency, the first frequency being different from the second frequency.

35. The transducer of claim 3 wherein the first direction is along an X-axis of a wire bonding machine and the second direction is along a Y-axis of the wire bonding machine.

36. The transducer of claim 3 wherein the first direction is along an X-axis of a wire bonding machine and the second direction is an XY shear direction.

37. The transducer of claim 3 wherein the first direction is along an Y-axis of a wire bonding machine and the second direction is an XY shear direction.

38. The transducer of claim 34 wherein the first frequency is approximately 115kHz and the second frequency is approximately 120 kHz.

39. The transducer of claim 34 wherein (1) application of the electrical energy at the first frequency, without application of the electrical energy at the second frequency, results in a scrub of a tip of the bonding tool in a first direction, (2) application of the electrical energy at the second frequency, without application of the electrical energy at the first frequency, results in a scrub of the tip of the bonding tool in a second direction, the first direction being different from the second direction, and (3) application of the electrical energy at the first frequency and the second frequency results in a non-linear scrub of the tip of the bonding tool.

40. The transducer of claim 39 wherein the first direction of the scrub extends along an X-axis of a wire bonding machine, and the second direction of the scrub extends along a Y-axis of the wire bonding machine.

41. The transducer of claim 39 wherein the first direction of the scrub extends substantially parallel to a longitudinal axis of the transducer, and the second direction of the scrub extends substantially perpendicular to the longitudinal axis of the transducer.

42. The transducer of claim 39 wherein the first direction of the scrub is substantially perpendicular to the second direction of the scrub.

43. The transducer of claim 3 wherein the first direction and the second direction are substantially perpendicular to one another.

44. The transducer of claim 3 wherein the body portion defines a driver aperture, and the plurality of piezoelectric elements are positioned in the driver aperture.

* * * * *